(12) United States Patent
Kuraguchi et al.

(10) Patent No.: US 8,963,203 B2
(45) Date of Patent: Feb. 24, 2015

(54) NITRIDE SEMICONDUCTOR DEVICE AND METHOD FOR MANUFACTURING SAME

(71) Applicant: Kabushiki Kaisha Toshiba, Tokyo (JP)

(72) Inventors: Masahiko Kuraguchi, Kanagawa-ken (JP); Akira Yoshioka, Kanagawa-ken (JP); Yoshiharu Takada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/792,410

(22) Filed: Mar. 11, 2013

(65) Prior Publication Data

US 2013/0248873 A1  Sep. 26, 2013

(30) Foreign Application Priority Data

Mar. 26, 2012  (JP) .................................. 2012-069987

(51) Int. Cl.
*H01L 29/66* (2006.01)
*H01L 29/812* (2006.01)
(Continued)

(52) U.S. Cl.
CPC ............ *H01L 29/812* (2013.01); *H01L 29/205* (2013.01); *H01L 29/66863* (2013.01); *H01L 29/4958* (2013.01); *H01L 29/4966* (2013.01); *H01L 29/7787* (2013.01); *H01L 29/42376* (2013.01); *H01L 29/452* (2013.01); *H01L 29/2003* (2013.01)
USPC .............................. 257/183; 257/76; 257/192

(58) Field of Classification Search
CPC ................ H01L 29/812; H01L 29/205; H01L 29/66863; H01L 29/4958; H01L 29/4966
USPC ............................................ 257/76, 192, 183
See application file for complete search history.

(56) References Cited

U.S. PATENT DOCUMENTS 6,140,169 A * 10/2000 Kawai et al. .................. 438/197
2006/0157735 A1    7/2006 Kanamura et al.
(Continued)

FOREIGN PATENT DOCUMENTS

JP        2006-196764 A    7/2006
JP        2010-10584 A     1/2010
(Continued)

OTHER PUBLICATIONS

Office Action issued Apr. 21, 2014 in Japanese Patent Application No. 2012-069987 (with English language translation).

*Primary Examiner* — Benjamin Sandvik
*Assistant Examiner* — Farid Khan
(74) *Attorney, Agent, or Firm* — Oblon, Spivak, McClelland, Maier & Neustadt, L.L.P.

(57) ABSTRACT

According to one embodiment, a nitride semiconductor device includes a substrate; semiconductor stacked layers including a nitride semiconductor provided on the substrate, and having a buffer layer, a carrier running layer provided on the buffer layer, and a barrier layer provided on the carrier running layer; a source electrode and a drain electrode provided on the semiconductor stacked layers and in contact with the semiconductor stacked layers; and a gate electrode provided on the semiconductor stacked layers and provided between the source electrode and the drain electrode. The gate electrode has a stacked structure, and a gate metal layer, a barrier metal layer, a first interconnection layer, and a second interconnection layer including Al are sequentially stacked from a side of a surface of the semiconductor stacked layers in the stacked structure.

12 Claims, 9 Drawing Sheets

(51) Int. Cl.
 *H01L 29/205* (2006.01)
 *H01L 29/49* (2006.01)
 *H01L 29/778* (2006.01)
 *H01L 29/423* (2006.01)
 *H01L 29/45* (2006.01)
 *H01L 29/20* (2006.01)

(56) References Cited

U.S. PATENT DOCUMENTS

2011/0210377 A1* 9/2011 Haeberlen et al. ............. 257/194
2012/0037918 A1* 2/2012 Miyazaki et al. ................ 257/76
2012/0217591 A1 8/2012 Kamada
2013/0056836 A1* 3/2013 Yu et al. ....................... 257/410
2013/0075826 A1* 3/2013 Xu ................................ 257/369
2013/0105811 A1* 5/2013 Ando et al. ..................... 257/76

FOREIGN PATENT DOCUMENTS

| JP | 2010-517302 | | 5/2010 | |
|---|---|---|---|---|
| JP | 2010-263127 | | 11/2010 | |
| JP | 2011-192719 | A | 9/2011 | |
| JP | 2011-238805 | A | 11/2011 | |
| JP | 2012-69978 | A | 4/2012 | |
| JP | 2012-178419 | A | 9/2012 | |
| WO | WO 2011/118098 | * | 9/2011 | ............ H01L 21/388 |

* cited by examiner

NITRIDE SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2012-069987, filed on Mar. 26, 2012; the entire contents of which are incorporated herein by reference.

FIELD

Embodiments described herein relate generally to a nitride semiconductor device and a method for manufacturing the same.

BACKGROUND

In a semiconductor device, it is effective to use a material having a high critical electric field in order to realize a high breakdown voltage and a low on-resistance. Since a nitride semiconductor has a high intensity of the critical electric field, the semiconductor device realizing the high breakdown voltage and the low on-resistance is achieved by using the nitride semiconductor.

In the nitride semiconductor device, a gate insulator on a hetero-junction, a barrier on the gate insulator, and a gate conductor on the barrier are formed, and characteristics of the nitride semiconductor can thus be drawn out.

DETAILED DESCRIPTION

In general, according to one embodiment, a nitride semiconductor device includes a substrate; semiconductor stacked layers including a nitride semiconductor provided on the substrate, and having a buffer layer, a carrier running layer provided on the buffer layer, and a barrier layer provided on the carrier running layer; a source electrode and a drain electrode provided on the semiconductor stacked layers and in contact with the semiconductor stacked layers; and a gate electrode provided on the semiconductor stacked layers and provided between the source electrode and the drain electrode.

The gate electrode has a stacked structure, and a gate metal layer, a barrier metal layer, a first interconnection layer, and a second interconnection layer including Al are sequentially stacked from a side of a surface of the semiconductor stacked layers in the stacked structure.

Hereinafter, embodiments will be described with reference to drawings. In the description below, the same components are denoted with the same symbols, and the repeated explanation of the components that have already been described is appropriately omitted.

First Embodiment

Figure 1A:
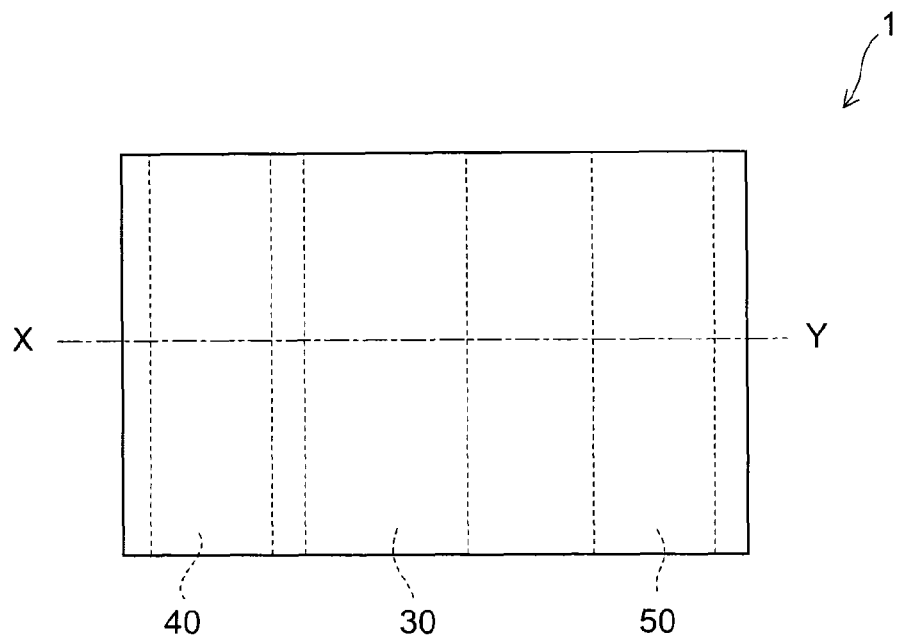
FIGS. 1A and 1B are schematic views of a nitride semiconductor device according to a first embodiment.
Figure 1B:
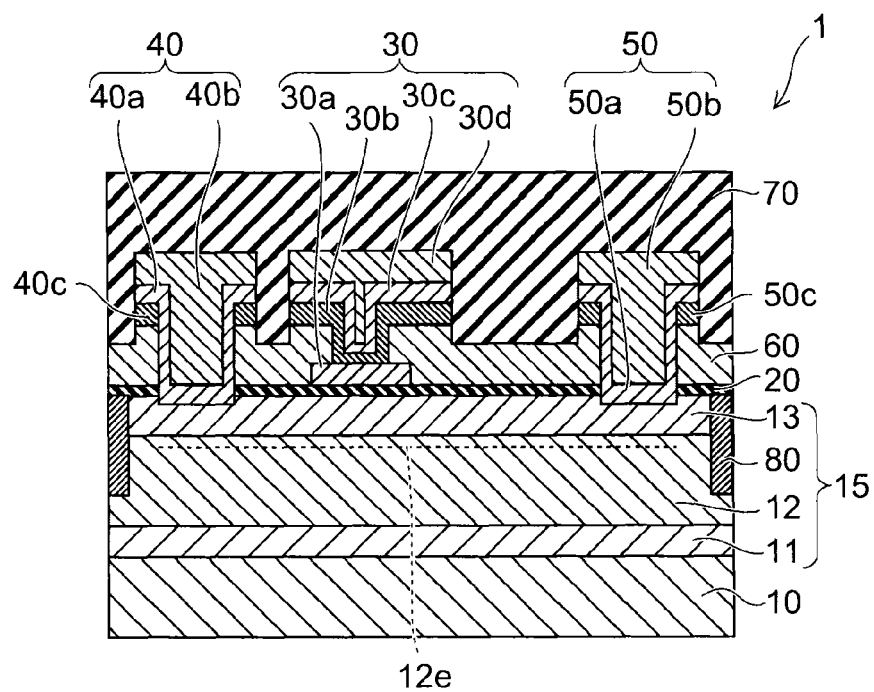

FIGS. 1A and 1B are schematic views of a nitride semiconductor device according to a first embodiment, wherein FIG. 1A is a schematic plan view, and FIG. 1B is a schematic cross-sectional view in an X-Y position of FIG. 1A.

The nitride semiconductor device 1 according to the first embodiment includes a foundation layer (also referred to as a substrate) such as a Si substrate 10, a semiconductor stacked body (also referred to as semiconductor stacked layers) 15 provided on the foundation layer and including a nitride semiconductor, a source electrode 40 and a drain electrode 50 provided on and in contact with the semiconductor stacked body 15, and a gate electrode 30 provided on the semiconductor stacked body 15 and provided between the source electrode 40 and the drain electrode 50.

The semiconductor stacked body 15 has a buffer layer 11, a carrier running layer 12 provided on the buffer layer 11, and a barrier layer 13 provided on the carrier running layer 12.

The gate electrode 30 has a stacked structure in which a gate metal layer 30a, a barrier metal layer 30b, an interconnection layer 30c (first interconnection layer 30c), and a second interconnection layer 30d including Al are sequentially stacked from a surface of the semiconductor stacked body 15.

In the nitride semiconductor device 1, the buffer layer 11 is provided on the Si substrate 10. The carrier running layer 12 including a GaN layer is provided on the buffer layer 11. The barrier layer 13 is provided on the carrier running layer 12. The barrier layer 13 is any one of a non-doped or n-type $Al_xGa_{1-x}N$ layer ($0<X\le1$), $In_YAl_{1-Y}N$ layer ($0<Y\le1$), a mixture of the non-doped or n-type $Al_xGa_{1-x}N$ layer ($0<X\le1$) and the $In_YAl_{1-Y}N$ layer ($0<Y\le1$), and a stacked body of the non-doped or n-type $Al_xGa_{1-x}N$ layer ($0<X\le1$) and the $In_YAl_{1-U}N$ layer ($0<Y\le1$). It is desired that a film thickness of the barrier layer 13 be appropriately 5 nm to 40 nm. A two-dimensional electron system 12e occurs near an interface between the carrier running layer 12 and the barrier layer 13 within the carrier running layer 12.

A gate insulating film 20 is provided on the barrier layer 13. A material of the gate insulating film 20 is any one of silicon nitride ($Si_3N_4$), silicon oxide ($SiO_2$), or aluminum oxide ($Al_2O_3$). The gate electrode 30 is provided on the gate insulating film 20. In addition, in the nitride semiconductor device 1, in addition to the gate electrode 30, the source electrode 40 in ohmic contact with the barrier layer 13 and the drain electrode in ohmic contact with the barrier layer 13 are provided.

The gate electrode 30 includes the gate metal layer 30a in direct contact with the gate insulating film 20, the barrier metal layer 30b, and the interconnection layers 30c and 30d. The interconnection layers are configured by two-layers such as the interconnection layer 30c and the interconnection layer 30d.

A material of the gate metal layer 30a is at least one selected from the group consisting of Ni, Ti, TiN, TiW, TaN, W, and the like, or a mixture in which Si is added to at least one selected from the group consisting of Ni, Ti, TiN, TiW, TaN, W, and the like. A material of the barrier metal layer 30b is a metal layer of at least one selected from the group consisting of Ti, TiN, TiW, TaN, and the like, or a mixture in which Si is added to at least one selected from the group consisting of Ti, TiN, TiW, TaN, and the like. A material of the interconnection layer 30c is any one of Ti, Ta, Mo, and the like. The interconnection layer 30d is any one of Al, AlSi, AlSiCu, AlCu, and the like. A composition of the gate metal layer 30a may be the same as the composition of the barrier metal layer 30b.

The source electrode 40 includes a contact layer 40a (first contact layer 40a) and a metal layer 40 (first metal layer 40b) including Al. A barrier metal layer 40c (first barrier metal layer 40c) is provided below a part of the source electrode 40. The contact layer 40a and the metal layer 40b including Al are divided as two layers in the drawing, but may have an integrated layer structure of which the composition is gradually changed.

A material of the contact layer 40a is any one of Ti, Ta, Mo, and the like. A material of the metal layer 40b including Al is any one of Al, AlSi, AlSiCu, AlCu, and the like. A material of the barrier metal layer 40c is any one of Ti, TiN, TiW, TaN, and the like.

The drain electrode 50 includes a contact layer 50a (second contact layer 50a) and a metal layer 50b (second metal layer 50b) including Al. A barrier metal layer 50c (second barrier metal layer 50c) is provided below a part of the drain electrode 50. The contact layer 50a and the metal layer 50b including Al are divided as two layers in the drawing, but may have an integrated layer structure of which the composition is gradually changed.

A material of the contact layer 50a is any one of Ti, Ta, Mo, and the like. A material of the metal layer 50b including Al is any one of Al, AlSi, AlSiCu, AlCu, and the like. A material of the barrier metal layer 50c is any one of Ti, TiN, TiW, TaN, and the like.

In addition, the contact layers 40a and 50a and the interconnection layer 30c of the gate electrode 30 have the same composition and the same film thickness, and the metal layers 40b and 50b and the interconnection layer 30d of the gate electrode 30 have the same composition and the same film thickness.

The source electrode 40 and the drain electrode 50 are in contact with the barrier layer 13 so as to protrude inside from a surface of the barrier layer 13.

A surface protection film (also referred to as a surface passivation film) 60 (first surface protection layer) is provided on the semiconductor stacked body 15. A material of the surface protection film 60 is any one of silicon nitride ($Si_3N_4$) and silicon oxide ($SiO_2$). The barrier metal layer 40c is provided between the surface protection film 60 and the source electrode 40, and the barrier metal layer 50c is provided between the surface protection film 60 and the drain electrode 50.

The barrier metal layers 40c and 50c and the barrier metal layer 30b of the gate electrode 30 have the same composition and the same film thickness.

The gate electrode 30 is buried in a region in which the surface protection film 60 is removed. The barrier metal layer 30b of the gate electrode 30 is provided between the interconnection layer 30c of the gate electrode 30 and the surface protection film 60.

In regions of the surface protection film 60 in which the gate electrode 30, the source electrode 40, and the drain electrode 50 are not formed, parts of the surface of the surface protection film are removed. A high breakdown voltage insulating film 70 covering the gate electrode 30, the source electrode 40, and the drain electrode 50 is formed on the surface protection film 60.

The high breakdown voltage insulating film 70 is provided on the semiconductor stacked body 15. Parts of the surface of the surface protection film 60 between the source electrode 40 and the gate electrode 30 and between the gate electrode 30 and the drain electrode 50 are removed, and the high breakdown voltage insulating film 70 is provided between the source electrode 40 and the gate electrode 30 and between the gate electrode 30 and the drain electrode 50 so as to be in contact with the removed surface of the surface protection film 60.

In addition, when the gate electrode 30, the source electrode 40, and the drain electrode 50 are used as a set of electrodes, a device isolation region 80 is provided in an inside of the carrier running layer 12 from the surface of the barrier layer 13 outside the set of electrodes.

Next, a procedure of manufacturing the nitride semiconductor device 1 will be described.

FIGS. 2A to 7 are schematic cross-sectional views describing the procedure of manufacturing the nitride semiconductor device.

Figure 2A:
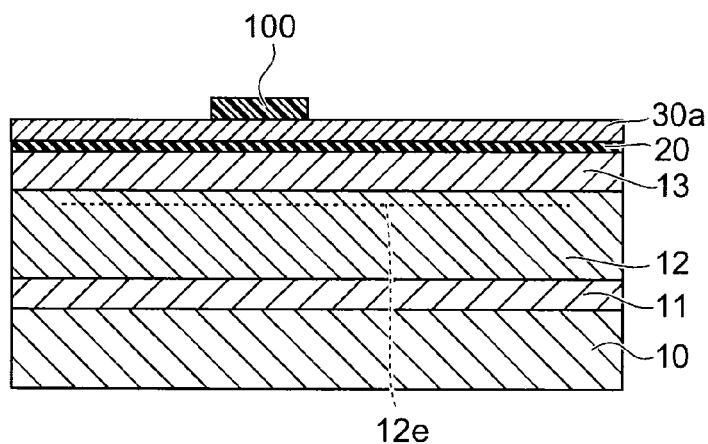
FIGS. 2A to 7 are schematic cross-sectional views describing the procedure of manufacturing the nitride semiconductor device.

As shown in FIG. 2A, the semiconductor stacked body 15 including the buffer layer 11, the carrier running layer 12 formed on the buffer layer 11, and the barrier layer 13 formed on the carrier running layer 12 is formed on the foundation layer.

For example, the buffer layer 11, the carrier running layer 12c including GaN, and the barrier layer 13 are sequentially stacked on the substrate 10 such as a Si substrate by an epitaxial growth method. The gate insulating film 20 is then formed on the semiconductor stacked body 15.

The gate metal layer 30a to be included in the gate electrode 30 is then selectively formed on the gate insulating film 20.

For example, the gate metal layer 30a formed of TiN is deposited by a sputtering method or the like. A resist mask 100 is then formed on the gate metal layer 30a in a region in which the gate is to be formed by a photolithography method or the like.

Figure 2B:
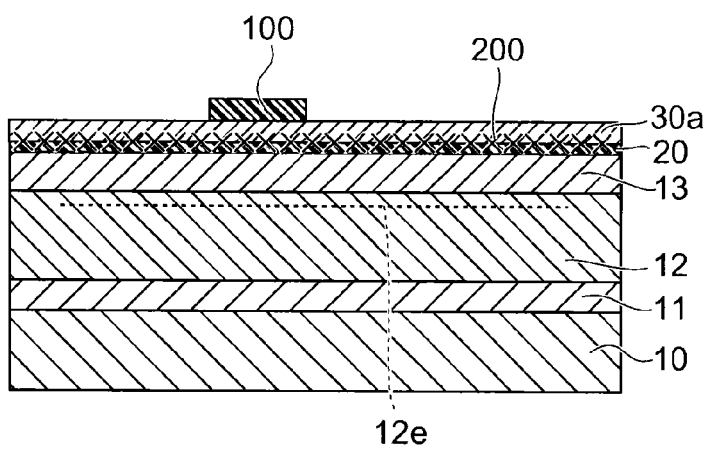

In this process, as schematically shown in FIG. 2B, damage 200 is introduced into the gate insulating film 20 when the gate metal layer 30a is formed by a sputtering method or the like. In particular, introduction of Ar ions at the time of sputtering or a deviation of the composition ratio of the surface of the gate insulating film is observed as the damage. In order to remove the damage, it is effective to carry out a thermal treatment in an $N_2$ atmosphere or the like. In this process, a relatively high temperature thermal treatment may be carried out since the source electrode 40 and the drain electrode 50 are not formed. As a result, the damage can be effectively removed. For example, after the gate metal layer 30a is formed, it is desired to effectively carry out the thermal treatment at a temperature of 400° C. or more and 900° C. or less. It is more desired to effectively carry out the thermal treatment at a temperature of 500° C. or more and 700° C. or less.

Figure 3A:
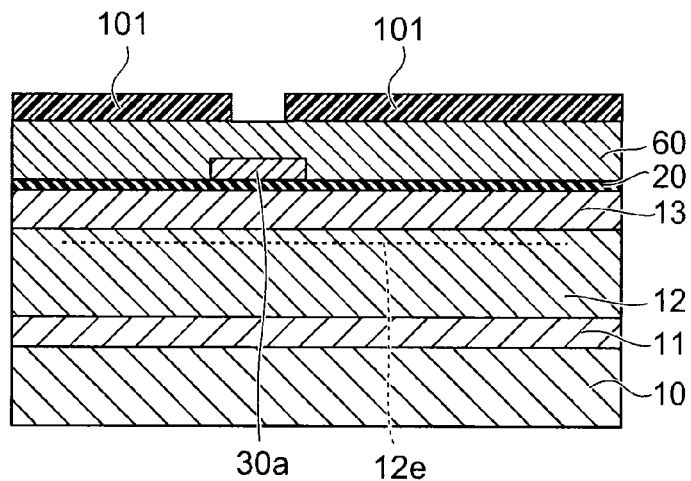

As shown in FIG. 3A, the surface protection film 60 is formed on the gate insulating film 20 and the gate metal layer 30a. For example, the gate metal layer 30a is processed to a desired shape by wet etching or the like using a mixed solution of ammonia water and hydrogen peroxide water, and the surface protection film 60 is formed. A resist mask 101 by which the surface protection film 60 on the gate metal layer 30a is opened is then formed by a photolithography method or the like.

Figure 3B:
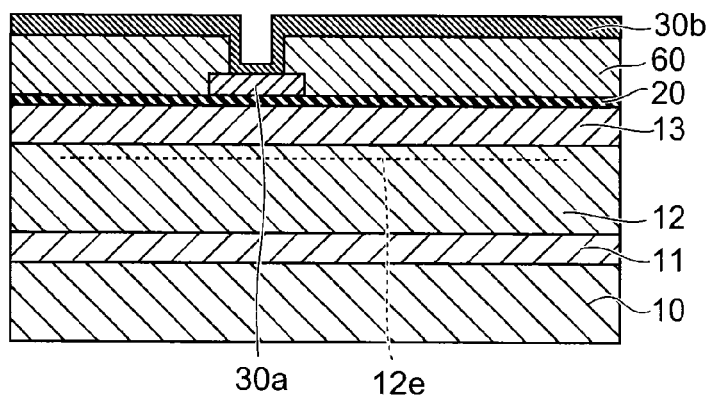

As shown in FIG. 3B, after the surface protection film 60 is etched by a reactive ion etching method or the like and the resist mask 101 is removed, the barrier metal layer 30b is formed. In this etching, since the gate metal layer 30a has been already formed on the gate insulating film 20 in the gate portion, the etching damage is not introduced in the gate insulating film 20.

In this manner, the gate metal layer 30a is formed in a predetermined position of the gate insulating film 20, and the surface protection film 60 is formed on the gate insulating film 20 and the gate metal layer 30a.

Further, the surface protection film 60 on the gate metal layer 30a is removed, and the barrier metal layer 30b is formed on the surface protection film 60 and on the gate metal layer 30a. By removing the surface protection film 60 on the gate metal layer 30a and forming the barrier metal layer 30b, it is possible to cause the gate metal layer 30a and the barrier metal layer 30b to be electrically in contact with each other without introducing the etching damage in the gate insulating film 20. Therefore, a channel resistance below the gate is suppressed from being increased, an on-resistance is suppressed from being increased, and the gate reliability is enhanced.

Here, in etching the surface protection film 60, an etching causing a trench sidewall to be vertical is illustrated. However, the trench sidewall is not limited to the vertical case, and may have a mesa shape having a predetermined angle or a shape having curvature. Since the barrier metal layer can more readily cover the etched portion of the surface protection film, reduction of device failure and suppression of deterioration of the breakdown voltage can be expected.

Figure 4A:
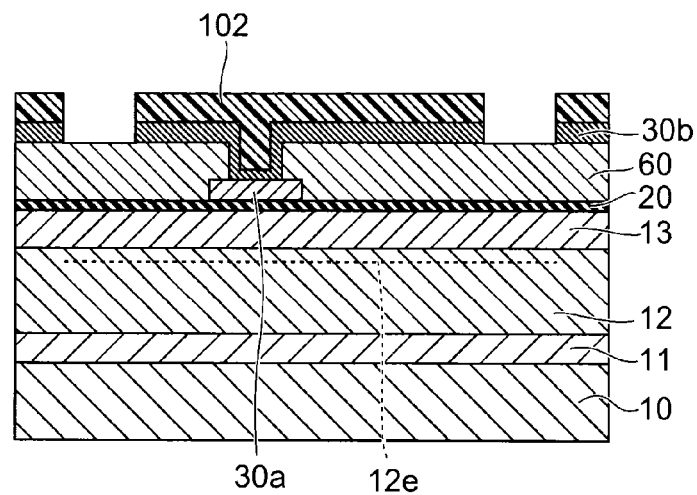

As shown in FIG. 4A, the barrier metal layer 30b in regions in which the source electrode 40 and the drain electrode 50 are to be formed is removed.

For example, a resist mask 102 by which a region in which the source electrode 40 is to be disposed and a region in which the drain electrode 50 is to be disposed are opened is formed on the barrier metal layer 30b by a photolithography method or the like. With the resist mask 103, the barrier metal layer 30b is etched by a reactive ion etching method or the like.

Figure 4B:
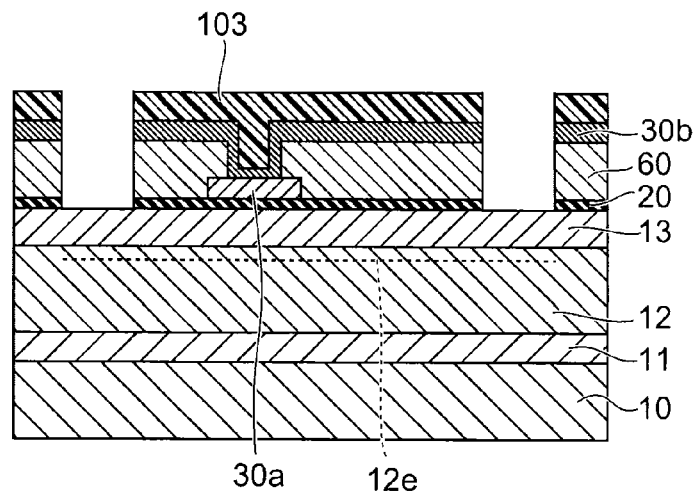

As shown in FIG. 4B, the surface protection film 60 in the regions in which the source electrode 40 and the drain electrode 50 are to be formed is removed using the barrier metal layer 30b as a mask, and parts of the surface of the barrier layer 13 are also removed.

For example, the surface protection film 60 and the gate insulating film 20 are etched by a reactive ion etching method or the like using the patterned barrier metal layer 30b and using a gas including fluorine such as $CF_4$, $SF_6$, or the like.

Figure 5A:
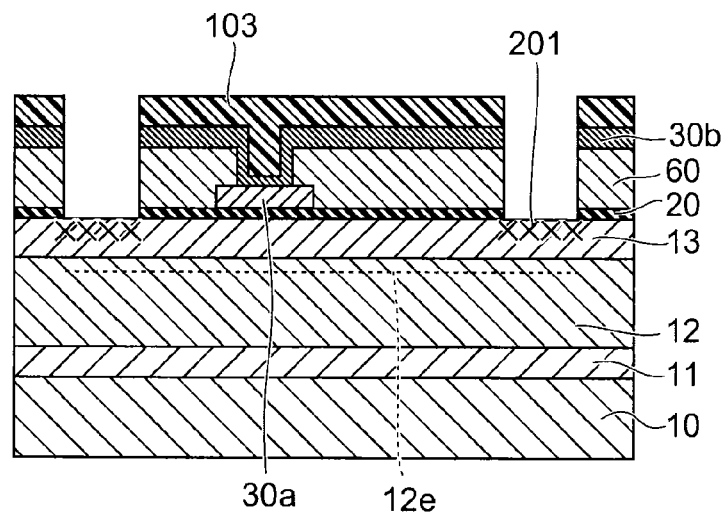

In this process, for example, F (fluorine) is introduced into the semiconductor layer as the damage 201 at the time of etching such as dry etching. For example, as shown in FIG. 5A, F ions remain in a lower portion of an ohmic electrode formation region. In this state, it is difficult to cause the source electrode 40 and the drain electrode 50 and the semiconductor layer to be favorably in ohmic contact with each other.

Figure 5B:
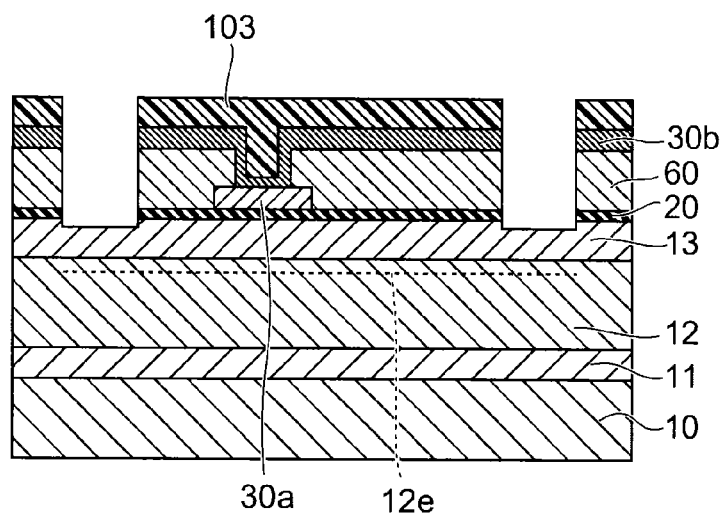

For this reason, parts of the surface of the barrier layer 13 are then etched by a reactive ion etching method or the like using a gas including Cl such as $Cl_2$, $BCl_3$, or $SiCl_4$. This state is shown in FIG. 5B.

It is desired that a depth for etching the parts of the surface of the barrier layer 13 be 2 nm or more and 15 nm or less. Therefore, the F ions introduced into the semiconductor can be removed, the contact resistance between the source electrode 40 and the semiconductor layer and the contact resistance between the drain electrode 50 and the semiconductor layer can be reduced, and the low on-resistance can be realized. Further, in order to suppress densities of the two-dimensional electron systems below the source electrode 40 and below the drain electrode 50 from being decreased, it is desired that the depth for etching the parts of the surface of the barrier layer 13 be 2 nm or more and 7 nm or less.

In addition, in the etching of this process, although the trench sidewall is processed to be vertical, the trench sidewall is not limited to the vertical case and may have a mesa shape having a predetermined angle or a shape having curvature. Therefore, contact areas between the source electrode 40 and the semiconductor layer and between the drain electrode 50 and the semiconductor layer are increased to reduce an on-resistance. In this manner, after the barrier metal layer 30b is formed, the barrier metal layer 30b only in the region in which the source electrode 40 and the drain electrode 50 are in contact with the semiconductor layer is removed, and the surface protection film 60 and parts of the surface of the barrier layer 13 are removed using the barrier metal layer 30b as a mask, thereby providing the nitride semiconductor device having a low on-resistance.

Figure 6A:
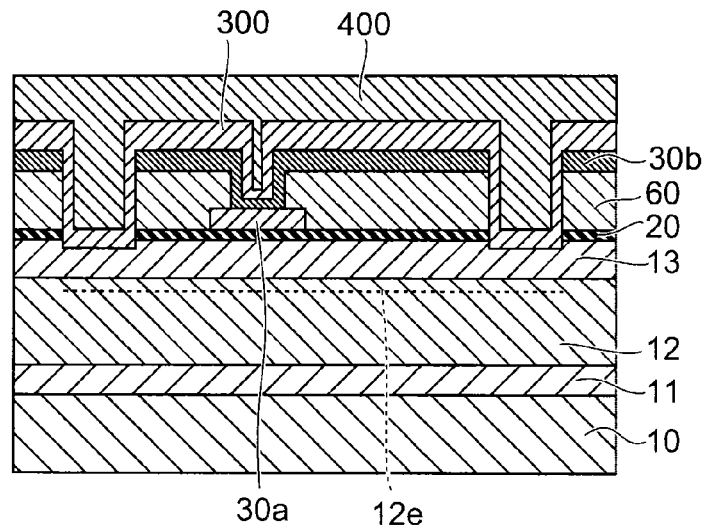

As shown in FIG. 6A, the resist mask 103 is removed, a contact layer 300 is formed on the barrier metal layer 30b and on parts of the surface of the barrier layer 13, and a metal layer 400 including Al is further formed on the contact layer 300. Here, the contact layer 300 is a precursor film before the contact layers 40a and 50a are processed, and the metal layer 400 is a precursor film before the metal layers 40b and 50b are processed.

In addition, although the trench sidewall in which the contact layer 300 and the metal layer 400 are buried is a vertical type, the trench sidewall is not limited to the vertical type and may have a mesa shape having a predetermined angle or a shape having curvature. Therefore, it is possible to readily bury the contact layer 300 and the metal layer 400 within the trench, and reduction of device failure and suppression of increase of the on-resistance can be expected.

Figure 6B:
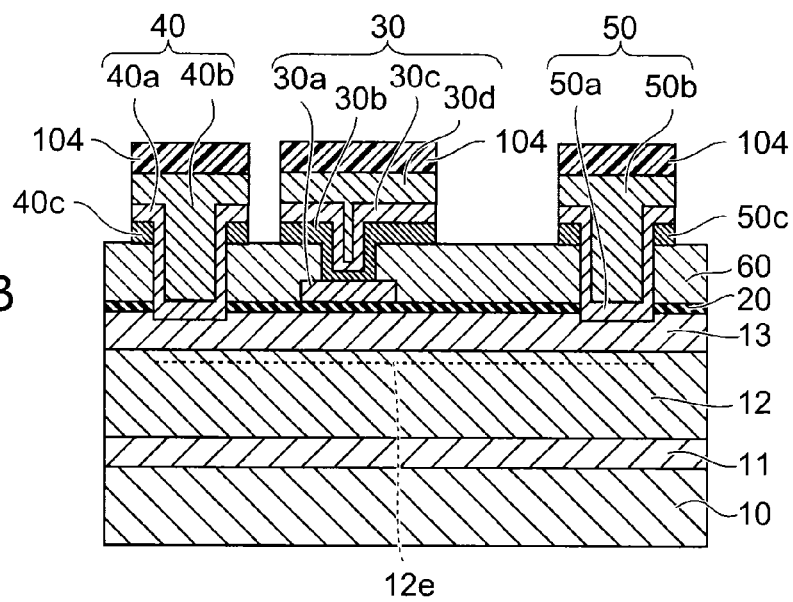

As shown in FIG. 6B, a mask 104 by which regions between a region in which the gate electrode 30 is disposed and a region in which the source electrode 40 is disposed and between the region in which the gate electrode 30 is disposed and a region in which the drain electrode 50 is disposed are opened is formed on the metal layer 400 including Al.

For example, the resist mask 104 by which regions except for the source electrode 40, the drain electrode 50, and the gate electrode 30 are opened is formed on the metal layer 400 including Al by a photolithography method or the like.

The contact layer 300 and the metal layer 400 including Al are then removed between the region in which the gate electrode 30 is disposed and the region in which the source electrode 40 is disposed and between the region in which the gate electrode 30 is disposed and the region in which the drain electrode 50 is disposed using the resist mask 104. For example, the contact layer 300 and the metal layer 400 including Al are etched by a reactive ion etching method.

Figure 7:
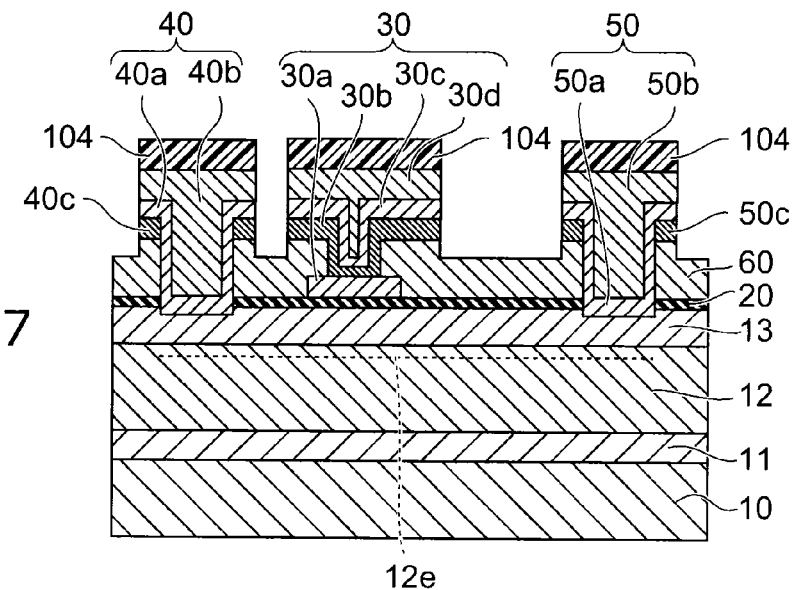

As shown in FIG. 7, parts of the surface of the surface protection film 60 are removed between the region in which the gate electrode 30 is disposed and the region in which the source electrode 40 is disposed and between the region in which the gate electrode 30 is disposed and the region in which the drain electrode 50 is disposed using the resist mask 104. For example, the parts of the surface of the surface protection film 60 are etched to be separate from a state shown in FIG. 6B or to be continued from the state by a reactive ion etching method or the like.

The resist mask 104 is then removed, a resist mask (not shown) is similarly formed by the photolithography method or the like, and the device isolation region 80 is formed by ion implantation or mesa-etching of the semiconductor. In addition, the nitride semiconductor device 1 shown in FIG. 1 is formed by forming the high breakdown voltage insulating film 70.

As described above, the contact layer 300 and the metal layer 400 including Al are formed, and the resist mask 104 by which the regions between the gate electrode 30 and the source electrode 40 and between the gate electrode 30 and the drain electrode 50 are opened is formed on the metal layer 400. By dividing the contact layer 300 and the metal layer 400 using the resist mask 104, it is possible to form interconnection layers of the source electrode 40 and drain electrode 50 and the gate electrode 30 at the same time.

In this manner, in the nitride semiconductor device 1, the gate metal layer 30a is formed on the gate insulating film 20, the surface protection film 60 on the gate metal layer is opened, and the barrier metal layer 30b and the interconnection layers 30c and 30d are buried in the opened portion. By providing the gate metal layer 30a on the gate insulating film 20, it becomes difficult for the gate insulating film 20 to receive the etching damage when the surface protection film 60 is opened.

Therefore, the channel resistance below the gate electrode 30 is suppressed from being increased, the on-resistance is suppressed from being increased, and the gate reliability is thus enhanced. In addition, in the nitride semiconductor device, there is a phenomenon called current collapse, which causes the operating current to be decreased or the resistance to be increased due to the damage and trap in the semiconductor layer or the gate insulating film. In the nitride semiconductor device 1, since the damage on the gate insulating film 20 can be reduced, the current collapse is suppressed.

By providing the interconnection layers 30c and 30d on the gate metal layer 30a, the gate resistance can be reduced and the high speed operation is possible. In the nitride semiconductor device 1, the barrier metal layer 30b is provided between the gate metal layer 30a and the interconnection layers 30c and 30d. Therefore, metal diffusion from the interconnection layers 30c and 30d to the surface protection film 60 is suppressed. In addition, by configuring the barrier metal layer 30b, the metal diffusion from the interconnection layer 30d including Al to the surface protection film 60 formed of silicon nitride or silicon oxide can be effectively suppressed. As a result, the deterioration of the breakdown voltage and the reliability deterioration due to the metal layer diffusion are prevented, and the nitride semiconductor device having a high breakdown voltage and a low on-resistance is thus realized.

In the nitride semiconductor device 1, any one of a Si substrate, a SiC substrate, or a sapphire substrate is used as the substrate 10. By using the Si substrate, the SiC substrate, or the sapphire substrate as the substrate 10, it is possible to perform crystalline growth of the semiconductor layer having a good quality on the substrate 10, and the crystalline quality of the semiconductor layer is enhanced. Therefore, it is possible to realize the nitride semiconductor having a high breakdown voltage and a low on-resistance.

The carrier running layer 12 including a GaN layer and the barrier layer 13 including non-doped or n-type $Al_xGa_{1-x}N$ ($0<X\le1$) are stacked on the buffer layer 11. In the embodiment, the structure of the semiconductor layers may not necessarily be limited to the above mentioned stacked layers. A nitride semiconductor in which the carrier running layer 12 including the GaN layer, and the barrier layer 13 made of the non-doped or n-type $Al_xGa_{1-x}N$ ($0<X\le1$) or $In_YAl_{1-Y}N$ ($0<Y\le1$), a mixture of the non-doped or n-type $Al_xGa_{1-x}N$ ($0<X\le1$) and $In_YAl_{1-Y}N$ ($0<Y\le1$), or a stacked structure of the non-doped or n-type $Al_xGa_{1-x}N$ ($0<X\le1$) and $In_YAl_{1-Y}N$ ($0<Y\le1$) are stacked may be used as the semiconductor layer. Therefore, the two-dimensional electron system 12e is formed near the interface between the carrier running layer 12 and the barrier layer 13 within the carrier running layer 12, and the nitride semiconductor device having a low on-resistance is realized.

In the nitride semiconductor device 1, by using the same material and the same composition of the gate metal layer 30a and the barrier metal layer 30b, the gate metal layer and the barrier metal layer can be formed by the same equipment. Therefore, it is possible to more readily manufacture the nitride semiconductor device.

In the nitride semiconductor device 1, Ti, Ta, Mo, or the like is used for the contact layers 40a and 50a, and Al, AlSi, AlSiCu, AlCu, or the like is used for the metal layers 40b and 50b including Al. By using the common material for the interconnection layer 30c of the gate electrode 30 and the contact layers 40a and 50a, the nitride semiconductor can be readily manufactured. Further, by using the common material for the interconnection layer 30d of the gate electrode 30 and the metal layers 40b and 50b including Al, the nitride semiconductor can be readily manufactured.

In the nitride semiconductor device 1, the source electrode 40 and the drain electrode 50 are buried in the regions in which parts of the surface of the surface protection film 60 are removed, and a part of the source electrode 40 and a part of the drain electrode 50 are provided on the surface protection film 60.

Each of the contact layers 40a and 50a is buried to be in direct contact with the barrier layer 13 and the surface protection film 60. Further, each of the metal layers 40b and 50b including Al is buried within the contact metal. Therefore, it is possible to suppress the metal from being diffused from the metal layers 40b and 50b including Al into the surface protection film 60 formed of silicon nitride or silicon oxide. Therefore, it is possible to suppress the deterioration of the breakdown voltage and the reliability deterioration of the nitride semiconductor device and to realize the low ohmic contact of the resistances between the semiconductor layer and the source electrode, and the semiconductor layer and the drain electrode, thereby realizing the nitride semiconductor device having a low on-resistance.

The barrier metal layers 40c and 50c are provided on the surface protection film 60 provided below the part of the source electrode 40 and the part of the drain electrode 50. By providing the barrier metal layers 40c and 50c, it is possible to more effectively suppress the metal from being diffused from the metal layers 40b and 50b including Al into the surface protection film 60 formed of the silicon nitride or the silicon oxide. Therefore, it is possible to suppress the deterioration of the breakdown voltage and the reliability deterioration of the nitride semiconductor device. In addition, by having the same film thickness and the composition of the barrier metal layers 40c and 50c as the film thickness and the composition of the barrier metal layer 30b of the gate electrode 30, it is possible to fabricate these layers at the same time in the manufacturing process and to more readily manufacture the nitride semiconductor device.

In the nitride semiconductor device 1, the gate electrode 30 is buried in the region in which a part of the surface protection film 60 is removed, and a part of the gate electrode 30 is provided on the surface protection film 60. In the gate electrode 30, the barrier metal layer 30b is buried to be in direct contact with the surface protection film 60, and the interconnection layers 30c and 30d are buried within the barrier metal layer 30b. Therefore, it is possible to suppress the metal from being diffused from the interconnection layers 30c and 30d into the surface protection film 60 formed of the silicon nitride or the silicon oxide. As a result, it is possible to suppress the deterioration of the breakdown voltage and the deterioration of the reliability of the nitride semiconductor device.

In the nitride semiconductor device 1, ends of the barrier metal layer 30b and the interconnection layers 30c and 30d of the gate electrode 30 facing the drain electrode 50 protrude toward the drain electrode 50 farther than an end of the gate metal layer 30a facing the drain electrode 50. Therefore, the barrier metal layer 30b and the interconnection layers 30c and 30d can be spaced from the two-dimensional electron system 12e by the film thickness of the surface protection film 60. When a high voltage is applied between the source and drain electrodes, the strength of the electric field is concentrated on the end of the gate electrode 30 facing the drain electrode 50. The concentration of the strength of the electric field can be suppressed by disposing the barrier metal layer 30b and the interconnection layers 30c and 30d. As a result, the nitride semiconductor having a high breakdown voltage can be realized.

In the nitride semiconductor device 1, the source electrode 40 and the drain electrode 50 are provided in the regions in which parts of the surface of the barrier layer 13 are removed. Since the source electrode 40 and the drain electrode 50 are buried in the regions in which parts of the surface protection film 60 are removed, when removing the parts of the surface protection film 60, the etching damage is introduced in the semiconductor layer below the regions in which the source electrode 40 and the drain electrode 50 are to be formed. The etching damage is damage occurring when F that is an element of a gas including fluorine such as $CF_4$, $SF_6$, or the like used at the time of etching is introduced into the semiconductor layer, or damage occurring when a composition ratio of nitrogen, Al, and Ga of the semiconductor layer is deviated.

In the nitride semiconductor device 1, by removing such damage, the ohmic contacts having a low resistance between the semiconductor layer and the source electrode 40 and a low resistance between the semiconductor layer and the drain electrode 50 are realized. As a result, the nitride semiconductor device having a low on-resistance is realized.

In the nitride semiconductor device 1, parts of the surface of the surface protection film 60 are removed between an end of the gate electrode 30 facing the source electrode 40 and an end of the source electrode 40 facing the gate electrode 30 and between an end of the gate electrode 30 facing the drain electrode 50 and an end of the drain electrode 50 facing the gate electrode 30. The high breakdown voltage insulating film 70 is buried in the region in which the surface protection film 60 is removed. When a high voltage is applied between the source and drain electrodes, an electric field is also concentrated on ends of the barrier metal layer 30b and the interconnection layers 30c and 30d facing the drain electrode 50 in addition to the end of the gate metal layer 30a facing the drain electrode 50. Accordingly, by providing the high breakdown voltage insulating film 70 between the end of the gate electrode 30 facing the drain electrode 50 and the end of the drain electrode 50 facing the gate electrode 30, the nitride semiconductor having a high breakdown voltage is realized.

In the nitride semiconductor device 1, the gate insulating film 20 is provided on the barrier layer 13, and the gate metal layer 30a is provided on the gate insulating film 20. In this manner, by interposing the gate insulating film 20 between the semiconductor layer and the gate electrode 30, it is possible to enhance the gate breakdown voltage and to realize the nitride semiconductor having a high breakdown voltage. It is effective to use a material that has a low interface state density formed while in contact with the nitride semiconductor and has a high intensity of the critical electric field as the gate insulating film 20. For this reason, it is desired that the gate insulating film 20 be formed of any one of silicon nitride, silicon oxide, and aluminum oxide.

It is effective to use a material that has a low interface state density formed while in contact with the gate insulating film 20 and has a high intensity of the critical electric field as the surface protection film 60. For this reason, it is desired that the surface protection film 60 be formed of any one of silicon nitride and silicon oxide.

It is effective to use a material that has a high intensity of the critical electric field as the high breakdown voltage insulating film 70. For this reason, it is desired that the high breakdown voltage insulating film 70 be formed of silicon oxide.

In the nitride semiconductor device 1, the device isolation region 80 is provided outside a set of the gate electrode 30, the source electrode 40, and the drain electrode 50. That is, the device isolation region 80 is provided farther outside than the end of any of the contact layers 40a and 50a, the metal layers 40b and 50b including Al, or the barrier metal layers 40c and 50c. Therefore, a voltage is prevented from being directly applied to the device isolation region 80 even when the voltage is applied between the source and drain electrodes. By causing the electric field of the device isolation region 80 to be weak to effectively suppress the leak current, the nitride semiconductor having a high breakdown voltage can be realized.

As described above, in the first embodiment, it is possible to readily provide the nitride semiconductor realizing a high breakdown voltage and a low on-resistance.

Second Embodiment

Figure 8:
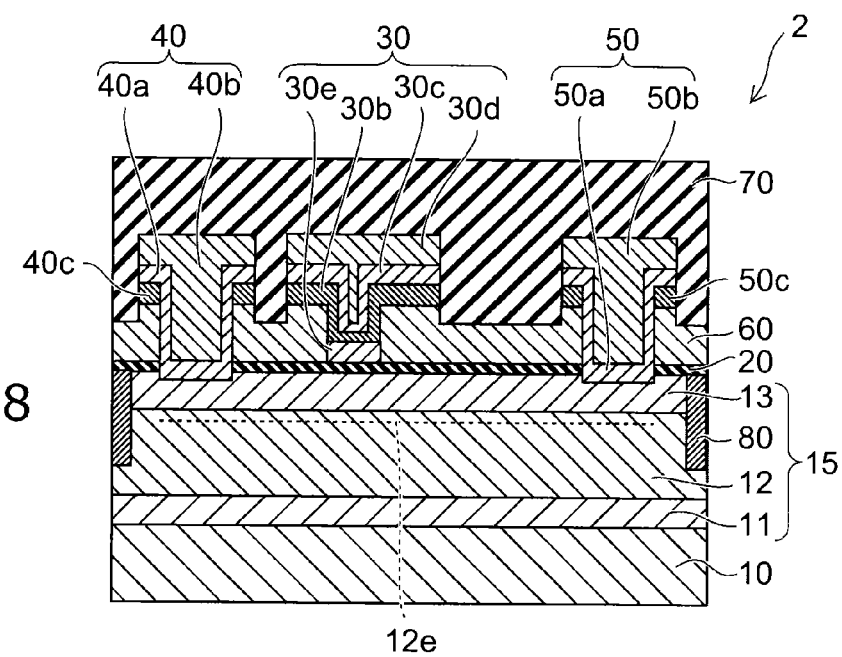
FIG. 8 is a schematic cross-sectional view illustrating a nitride semiconductor device according to a second embodiment.

FIG. 8 is a schematic cross-sectional view illustrating a nitride semiconductor device according to a second embodiment.

In the nitride semiconductor device 2 according to the second embodiment, a width of a gate metal layer 30e is smaller than a width of a gate metal layer 30a in comparison with the nitride semiconductor device 1 according to the first embodiment. A material of the gate metal layer 30e is the same as the material of the gate metal layer 30a. Here, the "width" of the member is defined as a length of the member in a direction from a source electrode 40 toward a drain electrode 50. In the nitride semiconductor device 2, the contact width between the gate metal layer 30e and the barrier metal layer 30b is the same as the width of the gate metal layer 30e.

In this manner, by causing the contact width between the gate metal layer 30e and a barrier metal layer 30b to be the same as the width of the gate metal layer 30e, it is possible to shorten the effective gate length of the nitride semiconductor device determined by the contact length between a gate insulating film 20 and the gate metal layer, thereby further reducing the on-resistance and obtaining the high speed operation.

Third Embodiment

Figure 9:
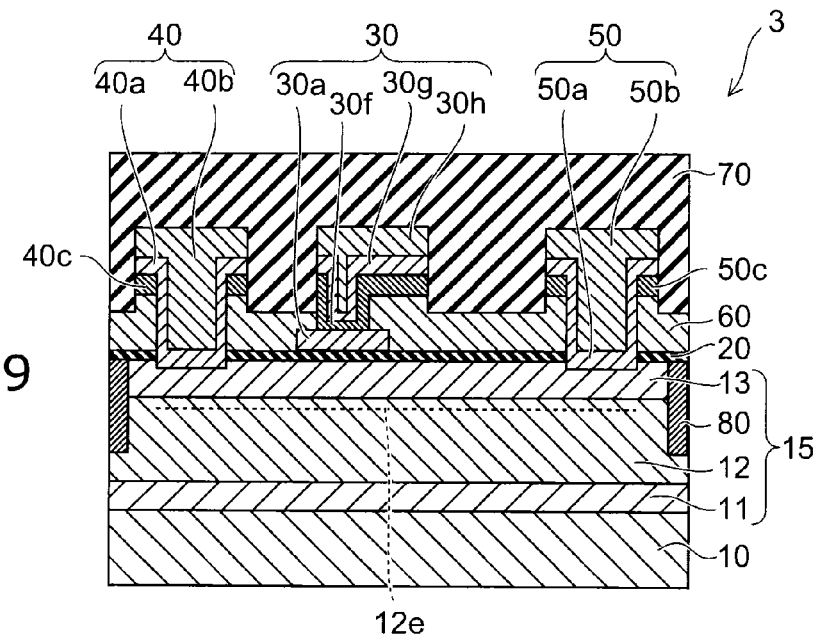
FIG. 9 is a schematic cross-sectional view illustrating a nitride semiconductor device according to a third embodiment.

FIG. 9 is a schematic cross-sectional view illustrating a nitride semiconductor device according to a third embodiment.

In the nitride semiconductor device 3 according to the third embodiment, a distance between a source electrode 50 and an end of each of a barrier metal layer 30f, an interconnection layer 30g, and an interconnection layer 30h is longer than a distance between an end of a gate metal layer 30a of a gate electrode 30 and the source electrode 50.

In other words, ends of the barrier metal layer 30f and the interconnection layers 30g and 30h of the gate electrode 30 facing a source electrode 40 are farther from the source electrode 40 than an end of the gate metal layer 30a facing the source electrode 40.

A material of the barrier metal layer 30f is the same as the material of the barrier metal layer 30b. A material of the interconnection layers 30g and 30h is the same as the material of the interconnection layers 30c and 30d. Therefore, in the nitride semiconductor device 3, it is possible to further reduce the distance between the source electrode 40 and the gate electrode 30 in comparison with the nitride semiconductor device 1.

Fourth Embodiment

Figure 10:
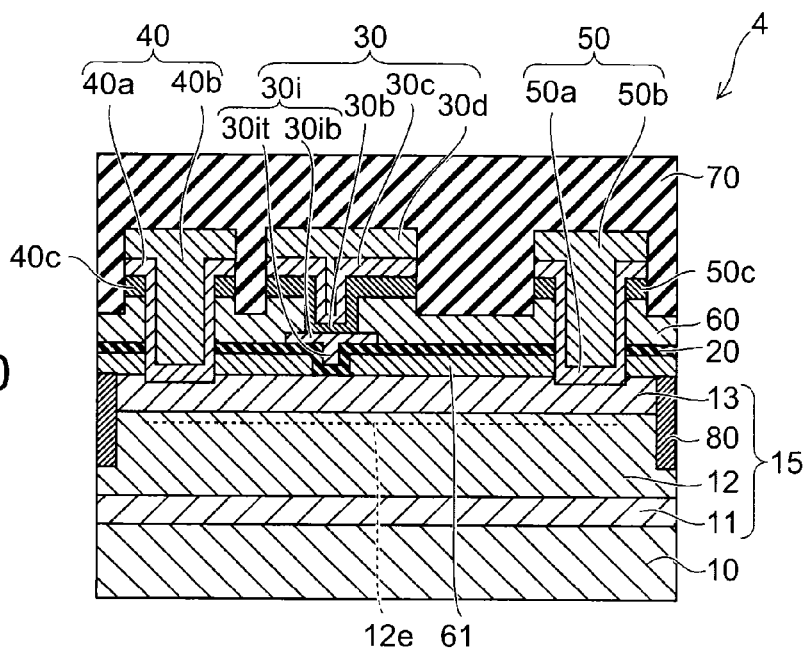
FIG. 10 is a schematic cross-sectional view illustrating a nitride semiconductor device according to a fourth embodiment.

FIG. 10 is a schematic cross-sectional view illustrating a nitride semiconductor device according to a fourth embodiment.

In the nitride semiconductor device 4 according to the fourth embodiment, a surface protection layer 61 (second surface protection layer) is provided between a barrier layer 13 and a gate insulating film 20. In addition, a gate metal layer 30i includes a base unit 30ib and a protrusion unit 30it extending from the base unit 30ib toward a substrate 10.

The surface protection layer 61 is provided between a gate electrode 30 and a source electrode 40 and between the gate electrode 30 and a drain electrode 50. This is different from the nitride semiconductor device 1 according to the first embodiment. After the surface protection film 61 is opened, the gate insulating film 20 is formed, and the gate metal layer 30i is formed on the gate insulating film 20.

This enables the effective gate length of the nitride semiconductor device determined by the contact length between the gate insulating film 20 and the gate metal layer to be shortened, thereby further reducing the on-resistance and obtaining the high speed operation. It is effective to use a material that has a low interface state density formed while in contact with the semiconductor layer and has a high intensity of the critical electric field as the surface protection film 61. For this reason, it is desired that the surface protection film 61 be any one of silicon nitride and silicon oxide.

Fifth Embodiment

Figure 11:
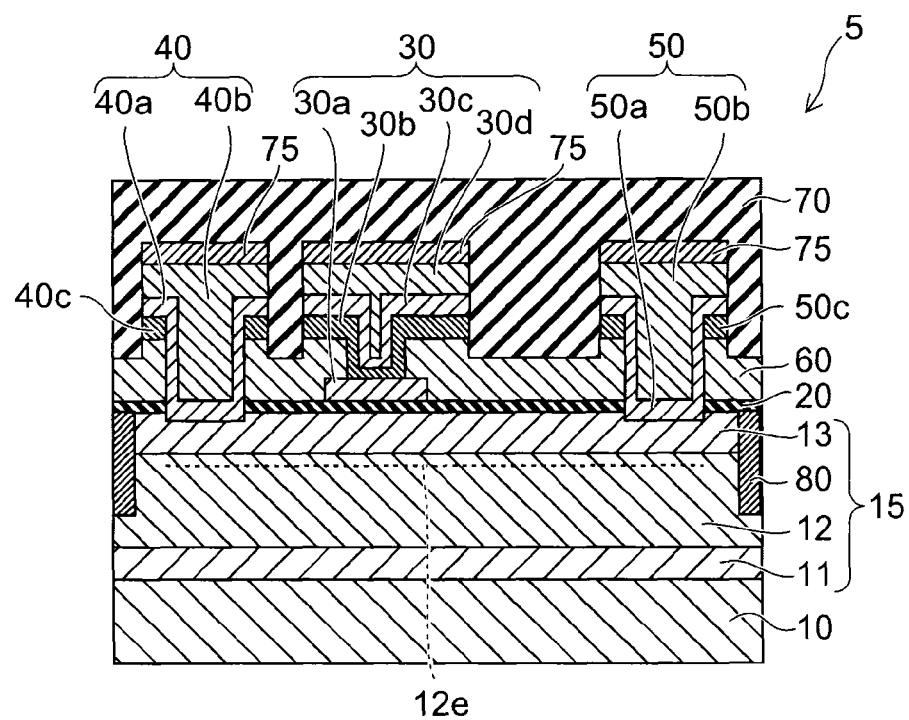
FIG. 11 is a schematic cross-sectional view illustrating a nitride semiconductor device according to a fifth embodiment.

FIG. 11 is a schematic cross-sectional view illustrating a nitride semiconductor device according to a fifth embodiment.

The basic structure of the nitride semiconductor device 5 according to the fifth embodiment is the same as that of the nitride semiconductor device 1. However, in the nitride semiconductor device 5 according to the fifth embodiment, a cap layer 75 is provided on each of an interconnection layer 30d, a metal layer 40b, and a metal layer 50b. This enables the adhesion between a high breakdown voltage insulating film 70 and each of a gate electrode 30, a source electrode 40, and a drain electrode 50 to be increased. A material of the cap layer 75 is any one of Ti, TiN, Ni, and the like.

As described above, according to the embodiments, it is possible to readily provide the nitride semiconductor device realizing the high voltage and the low on-resistance.

The "nitride semiconductor" in the specification includes semiconductors having all compositions in which each of the composition ratios x, y, and z within the range in the chemical formula of $B_xIn_yAl_zGa_{1-x-y-z}N$ ($0 \leq x \leq 1$, $0 \leq y \leq 1$, $0 \leq z \leq 1$, $x+y+z \leq 1$) is changed. In addition, in the above chemical formula, the composition further including group V elements other than N (nitrogen), the composition further including various elements added to control various physical properties such as a conductivity type, and the composition further including various elements that are included unintentionally are also included in the "nitride semiconductor."

The embodiments have been described above with reference to examples. However, the embodiments are not limited to these examples. More specifically, these examples can be suitably modified in design by those skilled in the art. Such modifications are also encompassed within the scope of the embodiments as long as they include the features of the embodiments. The components included in the above examples and their layout, material, condition, shape, size and the like are not limited to those illustrated, but can be suitably modified.

Furthermore, the components included in the above embodiments can be combined as long as technically feasible. Such combinations are also encompassed within the scope of the embodiments as long as they include the features of the embodiments. In addition, those skilled in the art can conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
    a substrate;
    semiconductor stacked layers comprising a nitride semiconductor provided on the substrate, and comprising a buffer layer, a carrier running layer provided on the buffer layer, and a barrier layer provided on the carrier running layer;
    a source electrode and a drain electrode provided on the semiconductor stacked layers and in contact with the semiconductor stacked layers;
    a gate insulating film provided on the semiconductor stacked layers;
    a surface passivation film provided on the gate insulating film; and
    a gate electrode provided on the gate insulating film and provided between the source electrode and the drain electrode,
    the gate electrode having a stacked structure, and a gate metal layer, a barrier metal layer, a first interconnection layer, and a second interconnection layer comprising Al being sequentially stacked from a top surface of the semiconductor stacked layers in the stacked structure,
    a portion of the gate electrode being provided in the surface passivation film,
    a portion of the barrier metal layer being provided between the first interconnection layer and the surface passivation film,
    a lower surface of the gate metal layer contacting to the gate insulating film, a first portion of a lower surface of the barrier metal layer contacting to the gate metal layer and a second portion of the lower surface of the barrier metal layer contacting to the surface passivation film.

2. The device according to claim 1, wherein the carrier running layer comprises a GaN layer, and
the barrier layer is any one of a non-doped or n-type $Al_xGa_{1-x}N$ layer ($0<X\leq1$), $In_YAl_{1-Y}N$ layer ($0<Y\leq1$), a mixture of the non-doped or n-type $Al_xGa_{1-x}N$ layer ($0<X\leq1$) and the $In_YAl_{1-Y}N$ layer ($0<Y\leq1$), and a stacked body of the non-doped or n-type $Al_xGa_{1-x}N$ layer ($0<X\leq1$) and the $In_YAl_{1-Y}N$ layer ($0<Y\leq1$).

3. The device according to claim 1, wherein the substrate is any one of a Si layer, a SiC layer, and a sapphire layer.

4. The device according to claim 1, wherein the barrier metal layer is a metal layer comprising at least one of TiN, TiW, TaN, and Ti.

5. The device according to claim 1, wherein the gate metal layer and the barrier metal layer have the same composition.

6. The device according to claim 1, wherein the source electrode comprises a first contact layer and a first metal layer including Al provided on the first contact layer,
the drain electrode comprises a second contact layer and a second metal layer including Al provided on the second contact layer,
the first and second contact layers and the first interconnection layer of the gate electrode have the same composition and the same film thickness, and
the first and second metal layers and the second interconnection layer of the gate electrode have the same composition and the same film thickness.

7. The device according to claim 1, further comprising:
a first barrier metal layer provided between the surface passivation film and the source electrode; and
a second barrier metal layer provided between the surface passivation film and the drain electrode,
wherein the first and second barrier metal layers and the barrier metal layer of the gate electrode have the same composition and the same film thickness.

8. The device according to claim 1, wherein a distance between the drain electrode and an end of each of the barrier metal layer, the first interconnection layer, and the second interconnection layer of the gate electrode is shorter than a distance between an end of the gate metal layer of the gate electrode and the drain electrode.

9. The device according to claim 1, wherein the source electrode and the drain electrode are in contact with the barrier layer so as to protrude inside from a surface of the barrier layer.

10. The device according to claim 1, further comprising:
a high breakdown voltage insulating film provided on the semiconductor stacked layers,
wherein parts of a surface of the surface passivation film are removed between the source electrode and the gate electrode and between the gate electrode and the drain electrode, and
the high breakdown voltage insulating film is provided between the source electrode and the gate electrode and between the gate electrode and the drain electrode so as to be in contact with the removed surface of the surface passivation film,
a bottom of the high breakdown voltage insulating film contacted to the surface of the surface passivation film is positioned between an upper surface of the gate insulating film and a bottom of the barrier metal layer provided on the surface passivation film.

11. The device according to claim 1, wherein the gate insulating film is any one of silicon nitride, silicon oxide, and aluminum oxide.

12. The device according to claim 1, wherein the surface passivation film is any one of silicon nitride and silicon oxide.

* * * * *